(12) United States Patent
Radulescu et al.

(10) Patent No.: US 8,357,571 B2
(45) Date of Patent: Jan. 22, 2013

(54) METHODS OF FORMING SEMICONDUCTOR CONTACTS

(75) Inventors: Fabian Radulescu, Chapel Hill, NC (US); Jennifer Gao, Raleigh, NC (US); Jennifer Duc, Cary, NC (US); Scott Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 156 days.

(21) Appl. No.: 12/879,398

(22) Filed: Sep. 10, 2010

(65) Prior Publication Data

US 2012/0119260 A1 May 17, 2012

(51) Int. Cl.
*H01L 29/778* (2006.01)

(52) U.S. Cl. ........ 438/172; 438/638; 438/639; 438/640; 257/E21.403; 257/E29.246; 257/E21.215

(58) Field of Classification Search ................... 438/172, 438/489, 739, 638, 640, 639; 257/194, E21.403, 257/E29.246, E21.215
See application file for complete search history.

(56) References Cited

U.S. PATENT DOCUMENTS

| | | | | |
|---|---|---|---|---|
| 6,316,793 | B1 * | 11/2001 | Sheppard et al. | 257/103 |
| 6,407,002 | B1 * | 6/2002 | Lin et al. | 438/713 |
| 6,475,836 | B1 * | 11/2002 | Suzawa et al. | 438/149 |
| 6,740,599 | B2 * | 5/2004 | Yamazaki et al. | 438/739 |
| 2004/0144991 | A1 * | 7/2004 | Kikkawa | 257/103 |
| 2007/0018199 | A1 * | 1/2007 | Sheppard et al. | 257/200 |
| 2007/0018210 | A1 * | 1/2007 | Sheppard | 257/289 |

OTHER PUBLICATIONS

Ping et al., "A High-Performance 0.13-μm AlGaAs/InGaAs pHEMT Process Using Sidewall Spacer Technology," 2005 CS MANTECH, 4 pages.

Nevers et al., "High Volume 0.25 μm AlGaAs/InGaAs E/D pHEMT Process Utilizing Optical Lithography," CS MANTECH Conference, May 18-21, 2009, Tampa, Florida, USA, 4 pages.

Sheppard et al., "High-Efficiency Amplifiers Using AlGaN/GaN HEMTs on SiC," CS MANTECH Conference, Apr. 24-27, 2006, Vancouver, British Columbia, Canada, pp. 175-178.

* cited by examiner

*Primary Examiner* — Thinh T Nguyen
(74) *Attorney, Agent, or Firm* — Myers Bigel Sibley & Sajovec

(57) ABSTRACT

Methods of forming semiconductor devices having customized contacts are provided including providing a first insulator layer and patterning the first insulator layer such that the first insulator layer defines at least one contact window. A second insulator layer is provided on the first insulator layer and in the at least one contact window such that the second insulator layer at least partially fills the at least one contact window. A first portion of the second insulator layer is etched such that a second portion of the second insulator layer remains in the at least one contact window to provide at least one modified contact window having dimensions that are different than dimensions of the at least one contact window. Related methods and devices are also provided.

19 Claims, 8 Drawing Sheets

METHODS OF FORMING SEMICONDUCTOR CONTACTS

STATEMENT REGARDING FEDERALLY SPONSORED RESEARCH OR DEVELOPMENT

This invention was developed under government Contract No. 05-D-6000, awarded by GaN MMIC Development, Department of the Navy. The U.S. Government has certain rights in this invention.

FIELD

This invention relates to semiconductor devices and, more particularly, to semiconductor contacts and related methods and devices.

BACKGROUND

Schottky barrier devices are widely used in many consumer, commercial and other applications. A Schottky barrier is a potential barrier formed at a metal-semiconductor junction, which has rectifying characteristics. Many Schottky barrier devices use wide bandgap semiconductors, such as silicon carbide, gallium nitride and/or gallium arsenide, which may be used for high power, high temperature and/or microwave applications. Semiconductor Schottky barrier devices include Schottky diodes, High Electron Mobility Transistors (HEMTs) and MEtal Semiconductor Field Effect Transistors (MESFETs). A HEMT is a field effect transistor that incorporates a junction between two materials with different bandgaps (i.e., a heterojunction) as the channel, instead of a doped region, as is generally the case in integrated circuit field effect transistors. A Schottky barrier gate is used to control a two-dimensional electron gas (2DEG) between a source region and a drain region. In a MESFET, a Schottky barrier gate is used to control conduction in a doped channel that is formed between source and drain regions.

The length of the Schottky gate contact of the semiconductor device may directly impact the operation speed and performance of the semiconductor device. Conventional methods of forming these gates typically consist of photoresist patterning followed by an etch of a dielectric down to the surface of the semiconductor. The gate length is defined by the dimension of the dielectric opening. The dielectric profile can be adjusted by adjusting the photoresist profile, which can vary from straight, perpendicular to slightly sloped. The slope is commonly achieved through a photoresist reflow step that consists of baking beyond the glass transition temperature. This process may be difficult to control and may not provide the variation requested by customers for their devices.

SUMMARY

Some embodiments discussed herein provide methods of forming semiconductor devices having customized contacts including providing a first insulator layer and patterning the first insulator layer such that the first insulator layer defines at least one contact window. A second insulator layer is provided on the first insulator layer and in the at least one contact window such that the second insulator layer at least partially fills the at least one contact window. A first portion of the second insulator layer is etched such that a second portion of the second insulator layer remains in the at least one contact window to provide at least one modified contact window having dimensions that are different than dimensions of the at least one contact window.

In further embodiments, the second insulator layer may be etched such that the second portion of the second insulator layer remains on a sidewall of the at least one contact window to provide the at least one modified contact window that is narrower than the at least one contact window.

In still further embodiments, a gate contact is provided in the at least one modified contact window, wherein the gate contact has a gate length of less than about 0.4 μm. Source and drain regions, a respective one of which is adjacent an opposing end of the gate contact may be provided and configured to provide a high electron mobility transistor (HEMT) or metal a semiconductor field effect transistor (MESFET).

In some embodiments, the gate contact may have a gate length of from about 0.1 μm to about 0.3 μm. The gate contact may have a T-gate structure.

In further embodiments, the first insulator layer may be provided on a wide bandgap semiconductor layer. The wide bandgap semiconductor layer may include gallium nitride (GaN) and/or silicon carbide (SiC).

In still further embodiments, patterning the first insulator layer may include patterning the first insulator layer to expose a portion of a surface of the wide bandgap layer through the at least one contact window in the first insulator layer. Etching a first portion of the second insulator layer may include etching a first portion of the second insulator layer such that a second portion of the second insulator layer remains in the at least one contact window so that less of the surface of the wide bandgap layer is exposed through the at least one modified contact window.

In some embodiments, the second insulator layer may include at least two insulator layers, a first layer of the second insulator layer on the first insulator layer and in the at least one contact window and a second layer of the second insulator layer on the first layer of the second insulator layer. The first layer of the second insulator layer may have a first etch rate associated therewith and the second layer of the second insulator layer may have a second etch rate associated therewith, the second etch rate being different than the first etch rate. The first etch rate may be slower or faster than the second etch rate.

In further embodiments, the first insulator layer has a thickness X and the second insulator layer has a thickness Y. A ratio of X to Y impacts the geometrical profile of the semiconductor contact. X may be equal to Y, X may be greater than Y or X may be less than Y. In certain embodiments, the second insulator may have a first thickness A and a second thickness B and a step coverage ratio of A/B may impact the geometrical profiles of the device.

In still further embodiments, the first insulator layer may have a first etch rate associated therewith and the second insulator layer may have a second etch rate associated therewith, the second etch rate being different than the first etch rate. The first etch rate may be slower or faster than the second etch rate.

Some embodiments of the present invention provide methods of forming a customized gate contact for a semiconductor device, the method including forming a first insulator layer defining a gate contact window therein and forming a second insulator layer on the first insulator layer and in the gate contact window. The second insulator layer is etched to provide a modified gate contact window. A gate contact is provided in the modified gate contact window. A profile of the gate contact is associated with relative thicknesses and/or etch rates of the first and second insulator layers. Furthermore, further control of the gate profile may be achieved by adjusting a step coverage ratio of the second dielectric layer.

In further embodiments, the second insulator layer may include at least two insulator layers and a profile of the gate contact may be associated with relative thicknesses and/or etch rates of the at least two insulator layers of the second insulator layers. The first layer of the second insulator layer may have a first etch rate associated therewith and the second layer of the second insulator layer may have a second etch rate associated therewith, the second etch rate being different than the first etch rate. The first etch rate may be slower or faster than the second etch rate.

Still further embodiments provide methods of controlling a geometrical profile of semiconductor contacts, the method including controlling relative thicknesses and/or etch rates of at least two insulator layers and/or a step coverage ration of a second of the at least two insulator layers to provide at least one customized contact window for semiconductor contacts.

Some embodiments provide semiconductor devices having customized contacts including a first insulator layer defining at least one contact window and a second insulator layer on the first insulator layer and in the at least one contact window such that a portion of the second insulator layer in the at least one contact window provides at least one modified contact window having dimensions that are different than dimensions of the at least one contact window.

In further embodiments, the at least one modified contact window may be narrower than the at least one contact window.

In still further embodiments, a gate contact may be provided in the at least one modified contact window and the gate contact may have a gate length of less than about 0.4 µm. Source and drain regions, a respective one of which is adjacent an opposing end of the gate contact may be provided and configured to provide a high electron mobility transistor (HEMT) or a metal semiconductor field effect transistor (MESFET).

In some embodiments, the gate contact may have a gate length of from about 0.1 µm to about 0.3 µm. The gate contact may have a T-gate structure.

In further embodiments, a wide bandgap semiconductor layer may be provided and the first insulator layer may be provided on the wide bandgap semiconductor layer. The wide bandgap semiconductor layer may include gallium nitride (GaN) and/or silicon carbide (SiC).

In still further embodiments, the second insulator layer may include at least two insulator layers. The first layer of the second insulator layer may be provided on the first insulator layer and in the at least one contact window. The second layer of the second insulator layer may be provided on the first layer of the second insulator layer. The first layer of the second insulator layer has a first etch rate associated therewith and the second layer of the second insulator layer has a second etch rate associated therewith, the second etch rate being different than the first etch rate. The first etch rate may be slower or faster than the second etch rate.

In some embodiments, the first insulator layer may have a thickness X and the second insulator layer may have a thickness Y. A ratio of X to Y may impact the geometrical profile of the semiconductor contacts. X may be equal to Y, X may be greater than Y and X may be less than Y.

In further embodiments, the first insulator layer has a first etch rate associated therewith and the second insulator layer has a second etch rate associated therewith, the second etch rate being different than the first etch rate. The first etch rate may be slower or faster than the second etch rate.

Still further embodiments provide a schottky barrier semiconductor device having a gate length of from about 0.1 µm to about 0.3 µm and a transconductance ($g_m$) of greater than about 320 mS/mm.

In some embodiments, the transconductance ($g_m$) may be from about 320 mS/mm to about 420 mS/mm. The device may include a first insulator layer defining at least one contact window and a second insulator layer on the first insulator layer and in the at least one contact window such that a portion of the second insulator layer in the at least one contact window provides at least one modified contact window having dimensions that are different than dimensions of the at least one contact window.

BRIEF DESCRIPTION OF THE DRAWINGS

FIGS. 1A through 5 are cross-sections illustrating methods of forming semiconductor contacts according to various embodiments described herein.

DETAILED DESCRIPTION

Figure 1:
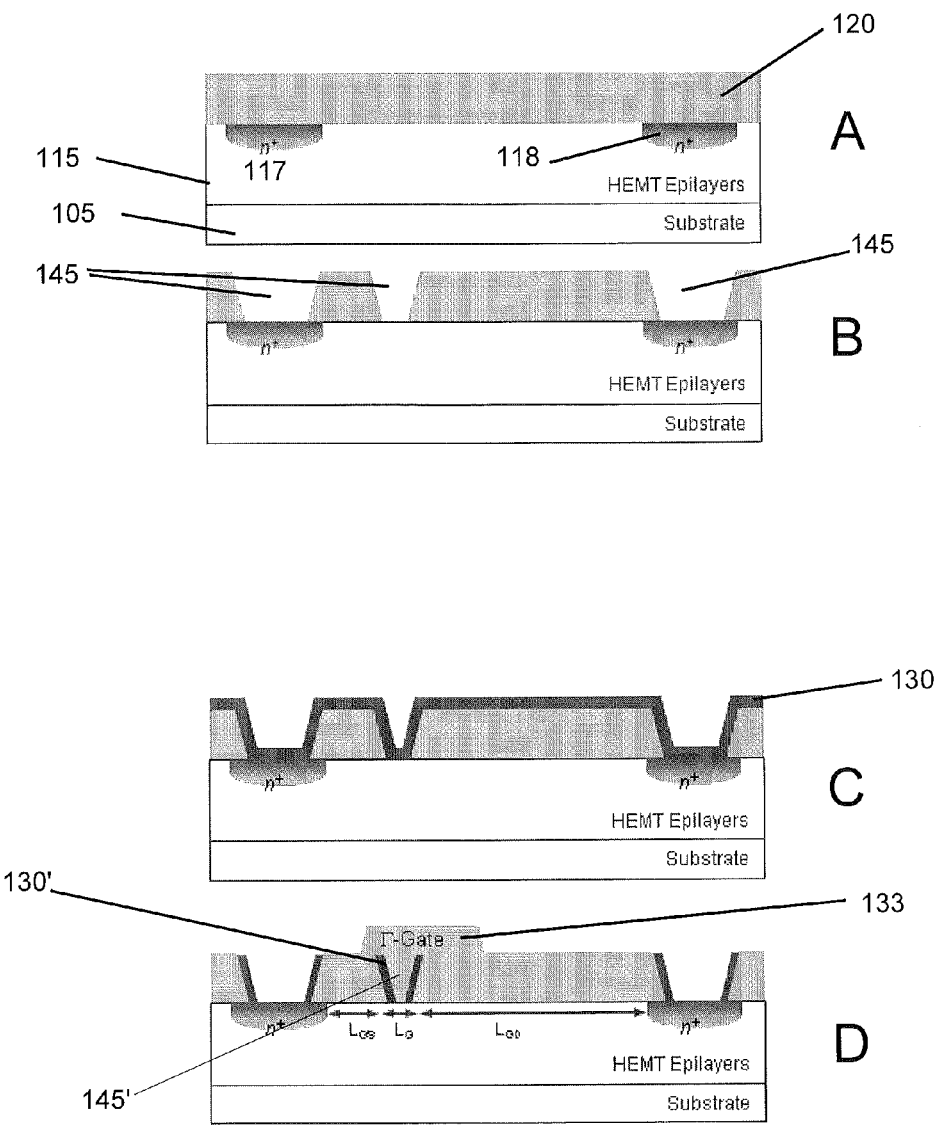

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises", "comprising", "includes" and/or "including" (and variants thereof), when used in this specification, specify the presence of stated features, steps, operations, elements, and/or components, but do not preclude the presence or addition of one or more other features, steps, operations, elements, components, and/or groups thereof. For example, when a layer is indicated as "comprising" a given material, the layer may include additional materials to form binary, ternary, quaternary etc., compounds, alloys, doped layers, etc. Thus, for example, a layer that comprises gallium nitride includes a layer of aluminum gallium nitride, indium gallium nitride and/or aluminum indium gallium nitride. In contrast, the term "consisting of" (and variants thereof) when used in this specification, specifies the stated features, steps, operations, elements, and/or components, and precludes additional features, steps, operations, elements and/or components. Finally, all of the above defined terms do not preclude the layer from being doped P-type and/or N-type using, for example, P-type dopants such as magnesium and/or N-type dopants such as silicon.

It will be understood that when an element such as a layer, region or substrate is referred to as being "on" another element (and variants thereof), it can be directly on the other element or intervening elements may also be present. Furthermore, relative terms such as "beneath", "overlies", "topside" and "backside" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention may be particularly well suited for use in nitride-based HEMTs, such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

It will be understood that although embodiments of the present invention may be described in connection with GaN HEMT devices, the present invention may be used in connection with other types of devices and/or materials without departing from the scope of the present application. For example, embodiments of the invention may also be used in other Schottky devices.

The geometry of the contact, for example, the gate contact, affects the electrical properties of the semiconductor device. A common method of forming these gate contacts typically consists of patterning a photoresist layer on top of a blanket insulator. The photoresist shape and etch process parameters of the conventional method may not allow for adequate control over the geometrical profile of the resulting pattern. Thus, according to some embodiments discussed herein, the geometrical profile of the semiconductor contacts may be controlled using a technology based on horizontal flow of electrical carriers, thus, allowing for customization of the contacts having various shape profiles.

In particular, in some embodiments, in addition to the conventional process, a second insulator layer is deposited and then a blanket etch is performed. The thickness of the insulator layers and/or the relative etch rates of the insulator layers may dictate the final shape of the etch profile. In some embodiments, the insulator layers may be dielectric layers. As used herein, a "dielectric layer" refers to an insulator layer or non-metal layer. The final profile for the dielectric window can be controlled by the amount of dielectric fill in relation to the thickness of the base dielectric layer, the presence of dual dielectric filling layers and/or the relative etch rates of the base dielectric versus the filling dielectric layers. The degree of the window fill directly affects the radius of the filling dielectric, which in turn controls the final slope of the window profile. Accordingly, some embodiments discussed herein can provide dielectric window profiles that encompass a great degree of customization as will be discussed further herein with respect to FIGS. 1A through 9 below.

Various embodiments of semiconductor Schottky barrier devices will be described herein. As used herein, the term "semiconductor Schottky barrier device" may include a Schottky diode, HEMT, MESFET and/or other semiconductor Schottky barrier device that includes one or more semiconductor layers, which may include silicon, silicon carbide, gallium nitride and/or other semiconductor materials. A semiconductor Schottky barrier device may or may not include a substrate such as a sapphire, silicon, silicon carbide, aluminum nitride and/or other microelectronic substrate(s).

Referring first to FIGS. 1A through 1D, processing steps in the fabrication of semiconductor contacts in accordance with some embodiments will be discussed. As illustrated in FIG. 1, a plurality of HEMT epilayers 115 may be sequentially provided on a substrate 105. In particular embodiments of the present invention, the substrate 105 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used in a relative rather than absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 105. For example, an AlN buffer layer may be provided to provide an appropriate crystal structure transition between the silicon carbide substrate and the remainder of the device.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

The HEMT epilayers 115 (wide bandgap layer 210, 310, 410, 510) may include a channel layer formed on the substrate 105. The channel layer may be formed on the substrate using buffer layers, transition layers, and/or nucleation layers as described above. The channel layer may be under compressive strain. Furthermore, the channel layer and/or buffer nucleation and/or transition layers may be epitaxially grown by metal-organic chemical vapor deposition (MOCVD) or by other techniques known to those of skill in the art, such as molecular beam epitaxy (MBE), hydride vapor phase epitaxy (HVPE) or other suitable techniques.

In some embodiments of the present invention, the channel layer is a Group III-nitride, such as $Al_xGa_{1-x}N$ where $0 \leq x < 1$, provided that the energy of the conduction band edge of the channel layer is less than the energy of the conduction band edge of the barrier layer at the interface between the channel and barrier layers. In certain embodiments of the present invention, x=0, indicating that the channel layer is GaN. The channel layer may also include other Group III-nitrides such as InGaN, AlInGaN or the like. The channel layer may be undoped ("unintentionally doped") and may be grown to a thickness of greater than about 20 Å. The channel layer may also be a multi-layer structure, such as a superlattice or combinations of GaN, AlGaN or the like.

A barrier layer may be formed on the channel layer. The barrier layer may have a bandgap that is greater than the bandgap of the channel layer and the barrier layer may also have a smaller electron affinity than the channel layer. The barrier layer may be epitaxially grown directly on the channel layer. In certain embodiments of the present invention, the barrier layer includes AlN, AlInN, AlGaN and/or AlInGaN with a thickness of between about 0.1 nm and about 10 nm. In some embodiments, the barrier layer may include $Al_xGa_{1-x}N$ where $0 \leq x < 0.32$. In particular embodiments, x=0.22.

While embodiments of the present invention are described herein with reference to particular HEMT structures, the present invention should not be construed as limited to such structures. For example, additional layers may be included in the HEMT device while still benefiting from the teachings of the present invention. Such additional layers may include a GaN cap layer on the barrier layer. Furthermore, the barrier layer may also be provided with multiple layers. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In particular embodiments of the present invention, the barrier layer is thick enough and has a high enough Al composition and doping to induce a significant carrier concentration at the interface between the channel layer and the barrier layer through polarization effects when the barrier layer is buried under ohmic contact metal. Also, the barrier layer should be thick enough to reduce or minimize scattering of electrons in the channel due to ionized impurities deposited at the interface between the barrier layer and a dielectric layer 120.

As noted above, the barrier layer may have a bandgap larger than that of the channel layer and a smaller electron affinity than the channel layer. Accordingly, in certain embodiments of the present invention, the barrier layer may include AlGaN, AlInGaN and/or AlN or combinations of layers thereof. The barrier layer should not be so thick as to cause cracking or substantial defect formation therein. In certain embodiments of the present invention, the barrier layer is undoped or doped with an n-type dopant to a concentration less than about $1 \times 10^{19}$ $cm^{-3}$. In some embodiments of the present invention, the barrier layer includes $Al_xGa_{1-x}N$ where $0 < x \leq 1$. In particular embodiments, the aluminum concentration may be about 25%. However, in other embodiments of the present invention, the barrier layer comprises AlGaN with an aluminum concentration of between about 5% and about 100%. In some embodiments of the present invention, the aluminum concentration is greater than about 10%.

Referring again to FIG. 1A, after formation of the implanted source 117 and drain 118 regions, which may be conventionally formed, a first (base) insulator layer 120 may be formed on the HEMT epilayers 115 and the source/drain regions 117/118. In some embodiments, the base insulator layer 120 may be a dielectric layer. Although embodiments of the present invention refer to base insulator layer 120 as a base dielectric layer, embodiments are not limited to this configuration. For example, other suitable insulators or non-metal layers may be used without departing from the scope of embodiments discussed herein.

In some embodiments, the dielectric layer 120 may include silicon nitride ($Si_xN_y$), silicon dioxide ($SiO_2$), AlSiN, aluminum nitride (AlN) and/or another suitable dielectric material, such as silicon oxynitride (SiON). It will be understood that the terms "$Si_xN_y$," "SiN" and "silicon nitride" are used herein interchangeably to refer to both stoichiometric and non-stoichiometric silicon nitride. Other materials may also be utilized for the dielectric layer 120. For example, the dielectric layer 120 could also include magnesium oxide, scandium oxide, aluminum oxide and/or aluminum oxynitride. Furthermore, the dielectric layer 120 may be a single layer or may include multiple layers of uniform and/or non-uniform composition. The material of the dielectric layer 120 should be capable of withstanding relatively high temperatures, and should be capable of being removed without significantly damaging the underlying layers.

In general, the dielectric layer 120 may be a dielectric layer that has a relatively high breakdown field strength and that provides a relatively low interface trap density at the interface with an underlying Group III-nitride layer. The dielectric layer 120 may have a high etch selectivity with respect to the material of the underlying layers, and may not be reactive to the material of the underlying layers. Moreover, the dielectric layer 120 may have a relatively low level of impurities therein. For example, the dielectric layer 120 may have a relatively low level of hydrogen and other impurities, including oxygen, carbon, fluorine and chlorine. In addition, the dielectric layer 120 may be stable at relatively high temperatures (e.g. >1000° C.) in order to withstand high annealing temperatures used in subsequent process steps.

Referring now to FIG. 1B, the dielectric layer 120 may be patterned using, for example, optical photolithography, to provide contact windows 145 therein. As illustrated in FIG. 1B, the contact windows 145 expose at least a portion of the HEMT epilayers 115 or the source/drain regions 117/118.

In accordance with some embodiments of the present invention, a second (filler) insulator layer 130 may be formed on the base dielectric layer 120 and in the contact windows 145 as illustrated in FIG. 1C. In some embodiments, the filler insulator layer 130 may be a dielectric layer. Although embodiments of the present invention refer to filler insulator layer 130 as a filler dielectric layer, embodiments are not limited to this configuration. For example, other suitable insulators or non-metal layers may be used without departing from the scope of embodiments discussed herein. The filler dielectric layer 130 may include the same materials discussed above with respect to the base dielectric layer 120.

As illustrated in FIG. 1D, a portion of the second dielectric 130 is removed from the base dielectric 120 and from the contact windows 145. The portion of the second dielectric layer may be removed using a controlled anisotropic etch. A portion of the second dielectric layer 130' remains on the base dielectric layer 120. As illustrated in FIG. 1D, in some embodiments the remaining portion of the second dielectric layer 130' is provided on sidewalls of the windows 145, thus exposing less of the surface of the HEMT epilayers 115 below. In other words, the provision of the second dielectric layer 130' on the sidewalls of the contact window 145 provide a modified contact window 145', which is narrow in comparison to the contact window 145 illustrated in FIG. 1B. The gate contact 133 may be provided in the modified contact window 145' exposing a narrower portion of the surface of the HEMT epilayer 115. Thus, a gate length $L_G$ of the gate contact may be decreased from about 0.4 μm to from about 0.1 to about 0.3 μm. As illustrated, in some embodiments, the gate contact 133 may have a T-gate structure. The gate metal may include nickel, for example, evaporated Nickel-Platinum-Gold (NiPtAu), but can be any suitable metal without departing from the scope of embodiments discussed herein.

Furthermore, the in some embodiments, the gate to source length $L_{GS}$ may be from about 0.4 μm to about 2.0 μm and the gate to drain length $L_{CD}$ may be from about 1.0 μm to about 10.0 μm.

The ability to provide shorter gate lengths ($L_G$) may provide improved performance of the device. Performance characteristics of the device illustrated in FIGS. 1A through 1D will be discussed further below with respect to FIGS. 6 and 7.

The length of the gate (LG), i.e., how much of the wide bandgap layer/HEMT epilayers 115 is exposed in the gate window, may be customized in accordance with some embodiments discussed herein. The profile of the window can be affected by a ratio of the thickness of the base dielectric layer 120 to the filler dielectric layer 130, the presence of a multiple layer filler dielectric layer 130 and the relative etch rates of the base dielectric layer 120 and/or the at least one filler dielectric layer 130. Thus, since the profile of the window is affected by these variations of thicknesses and etch rates, the profile of the window can be customized by controlling the ratio of the thicknesses of the dielectric layers and the etch rates of each of the dielectric layers present. Details with respect to various customized window profiles will be discussed below with respect to FIG. 2A through 5.

Although FIGS. 1A through 1D illustrate a HEMT, embodiments of the present invention are not limited to this configuration. For example, the device may be a wide bandgap Schottky barrier device without departing from the scope of the present invention. The wide bandgap Schottky barrier device may be, for example, a Schottky diode, a HEMT and a MESFET according to various embodiments described herein. In particular, FIGS. 2A through 5 all include a semiconductor layer 210, 310, 410 and 510, which may be a wide bandgap semiconductor layer in some embodiments. In embodiments having the bandgap semiconductor layer, the layer 210, 310, 410 and 510 may include, for example, material(s) having a bandgap of at least about 1.7 eV, such as silicon carbide (SiC) and/or gallium nitride (GaN). The wide bandgap semiconductor layer 210, 310, 410 and 510 may be freestanding, may include a portion of a substrate or may itself be on a substrate. Various buffer layers and/or other layers may also be provided as discussed above with respect to the HEMT of FIGS. 1A through 1D. In other words, the HEMT epilayers 115 of FIGS. 1A through 1D may be considered the wide bandgap layer thereof.

Figure 2A:
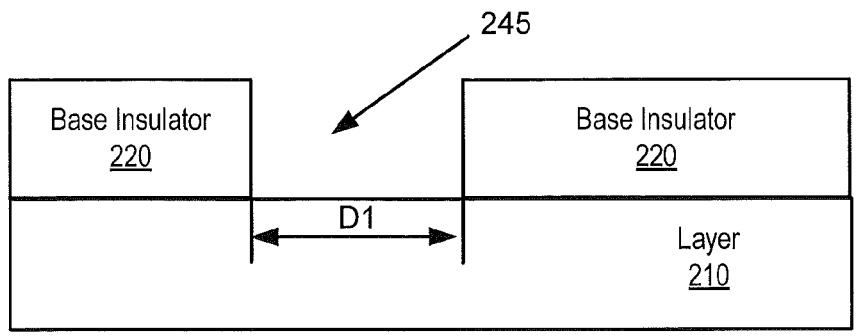

Referring now to FIG. 2A, processing steps in the fabrication of semiconductor devices in accordance with some embodiments will be discussed. As illustrated in FIG. 2A, a base dielectric layer 220 is formed on a wide bandgap semiconductor layer 210. It will be understood that source and drain regions (117 and 118 of FIG. 1A) may be present, but are not shown. The base dielectric layer 220 may include similar materials as those discussed above with respect to base dielectric layer 120 and, therefore, will not be repeated herein. As further illustrated in FIG. 2A, the base dielectric layer 220 may be patterned and etched in a conventional manner to provide a contact window 245 therein. It will be understood that although FIG. 2A only illustrates a single contact window, which will be discussed as the gate window below, methods in accordance with embodiments discussed herein can be used in conjunction with more than one contact window, for example, the source and drain windows illustrated in FIGS. 1B through 1D, without departing from the scope of embodiments discussed herein.

As further illustrated in FIG. 2A, once patterned and etched, the base dielectric 220 defines a contact window 245 having a first dimension D1. The first dielectric may also have a thickness X and an associated etch rate.

Figure 2B:
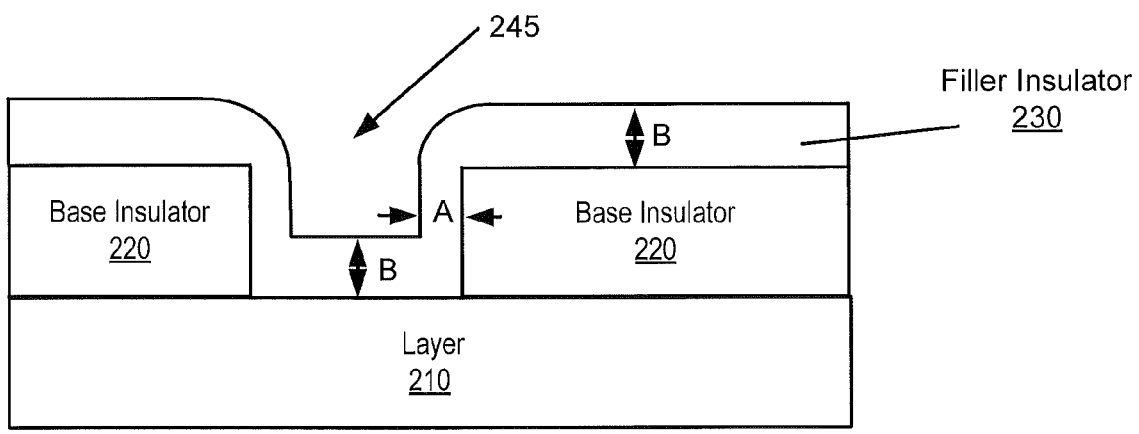

Referring now to FIG. 2B, a filler dielectric layer 230 may be formed on the based dielectric 220 and in the window 245. As illustrated in embodiments of FIG. 2B, the filler dielectric 220 only fills a portion of the window 245. The filler dielectric layer 230 also has a thickness Y and an associated etch rate. The thickness and etch properties of the filler dielectric 230 relative to those of the base dielectric 220 dictate the final profile of the contact window. X can be equal to Y, X can be greater than Y or X can be less than Y without departing from the scope of embodiments discussed herein.

In some embodiments, the filler dielectric 330 does not have a single thickness Y, but has multiple thicknesses. As illustrated in FIG. 2B, the filler dielectric 230 in this embodiment does not have a uniform thickness over the entire device. The step coverage ratio of a thickness A of the filler dielectric 230 to a thickness B of the filler dielectric 230 can affect the outcome of the profile. In some embodiments, the step coverage ratio of A/B can be from about 0.3 to about 1.0. In some embodiments, the step coverage ration of A/B is less than about 0.7.

Figure 2C:
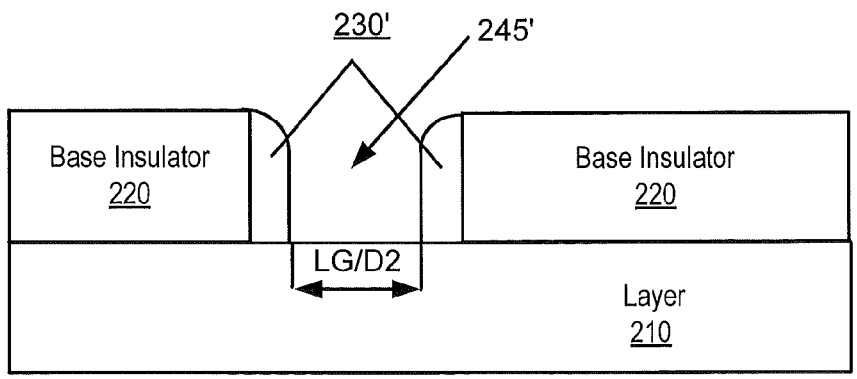

Referring now to FIG. 2C, once the filler dielectric 230 has been deposited on the base dielectric 220 and in the window 245, a blanket etch of the dielectrics is performed to provide a modified contact window 245', having a second dimension D2 associated therewith, that is smaller/narrower than the first dimension D1 associated with the contact window 245 of FIG. 2A. The smaller dimension D2 results from the presence of the filler dielectric 230' on the sidewalls of the contact window 245. Thus, less of the wide bandgap layer 210 is exposed through the modified contact window 245' than through the contact window 245 of FIG. 2A. The ability to control the dimension D1/D2 allows the gate length $L_G$ of the gate contact (not shown) to be controlled. Thus, a gate length of 0.4 µm may be reduced to about 0.1 µm to about 0.3 µm, allowing a great degree of customization. In particular, the speed of the device is determined by the area where the gate contact contacts the substrate (wide bandgap layer 210) and the slope of the sidewalls of the contact window. The shorter the gate length LG, the faster the device. Thus, the ability to control the gate length $L_G$ in accordance with some embodiment discussed herein may allow a great degree of customization in device performance.

For example, referring in particular to the device illustrated in FIG. 2C, the small curvature of the filler dielectric 230' remaining on the sidewalls may translate to reduced slope after the blanket etch, thus, affecting the speed of the device.

Figure 3A:
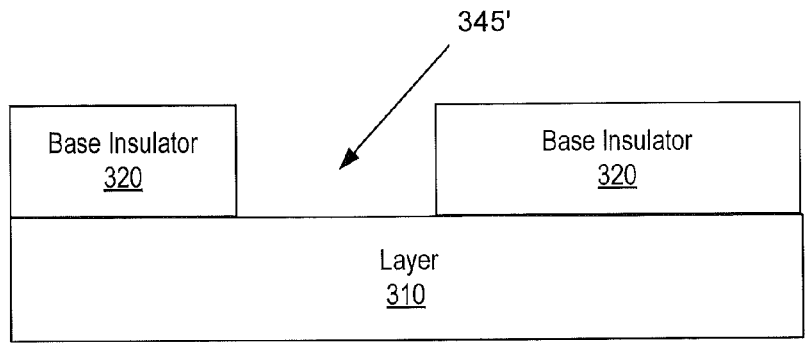
Figure 3B:
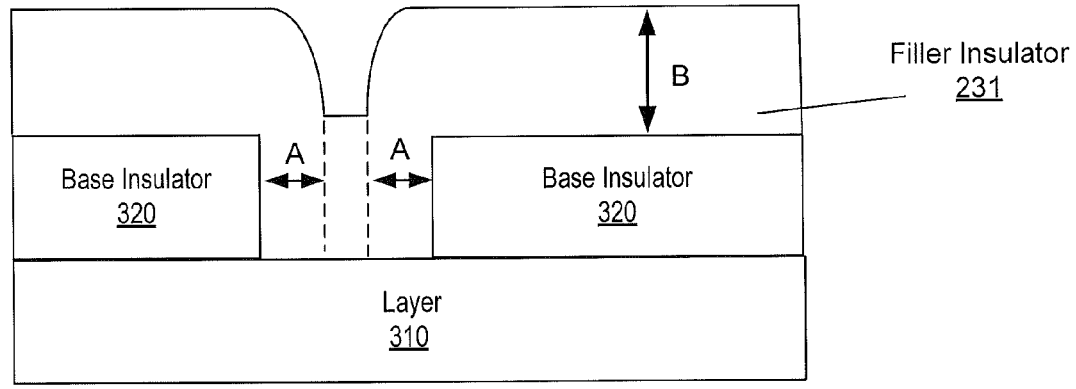
Figure 3C:
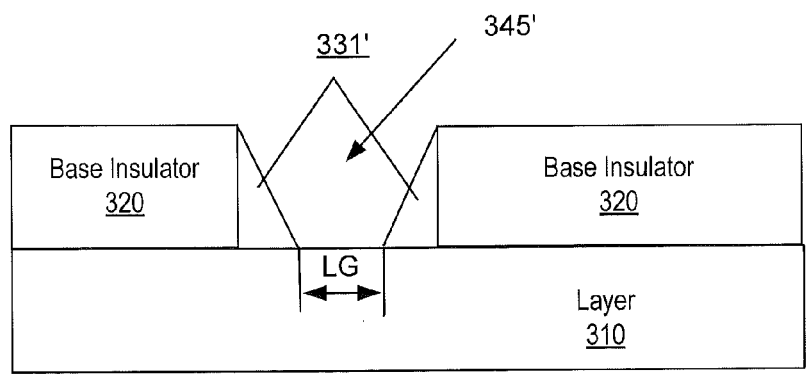

Referring now to FIGS. 3A through 3C, processing steps in the fabrication of devices in accordance with some embodiments will be discussed. Like reference numerals refer to like elements throughout, therefore, details with respect to like elements will not be repeated herein. Referring now to FIG. 3B, a filler dielectric 231 having a thickness Y that exceeds the thickness of the base dielectric 320 is provided in the base dielectric 320 and in the contact window 345. In these embodiments, the larger corner radius may increase the slope of the final profile as illustrated in FIG. 3C. In particular, the slope of the filler dielectric 331' remaining on the sidewalls of the contact window 345' is increased. Furthermore, the portion of the wide bandgap layer 310 exposed by the contact window 345' relatively smaller. Thus, the gate length $L_G$ of the gate contact (not shown) provided in the contact window 345' will be shorter.

In some embodiments, the filler dielectric 330 does not have a single thickness Y, but has multiple thicknesses. As illustrated in FIG. 3B, the filler dielectric 330 in this embodiment does not have a uniform thickness over the entire device. The step coverage ratio of a thickness A of the filler dielectric 330 to a thickness B of the filler dielectric 330 can affect the outcome of the profile. In some embodiments, the step coverage ratio of A/B can be greater than about 0.7.

Figure 4A:
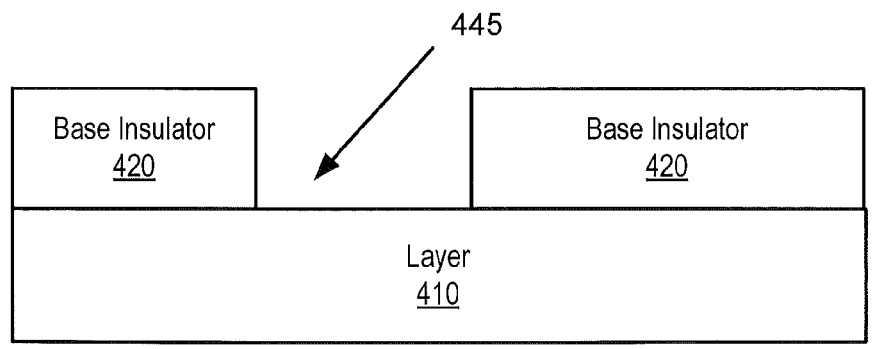
Figure 4B:
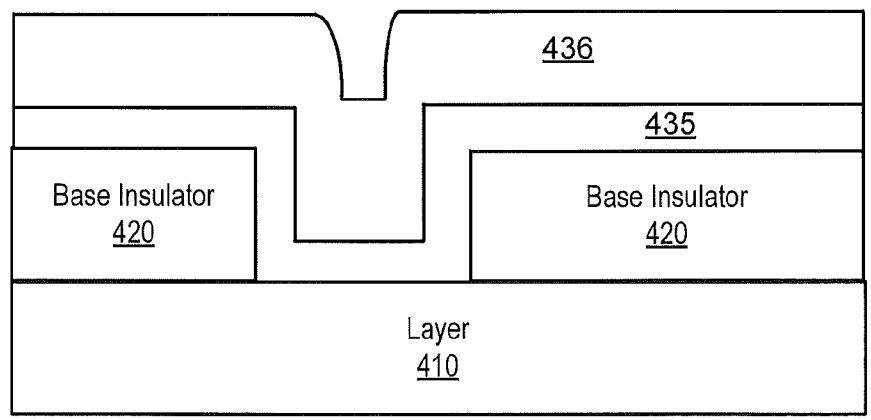
Figure 4C:
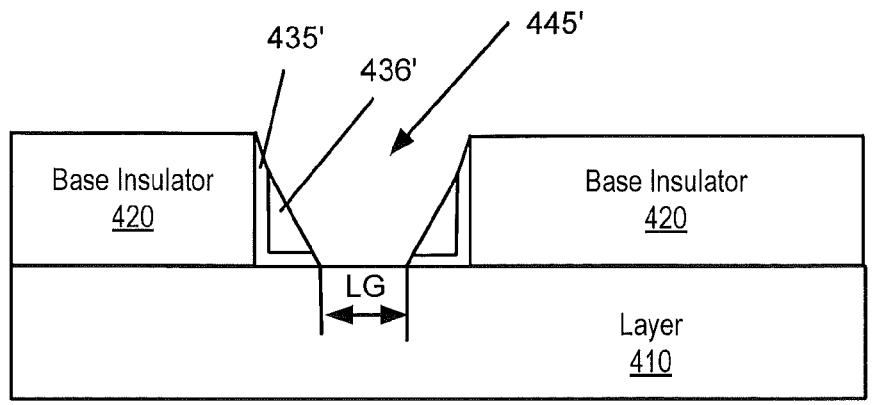

Referring now to FIGS. 4A through 4C, processing steps in the fabrication of device in accordance with some embodiments will be discussed. Like reference numerals refer to like elements throughout, therefore, details with respect to like elements will not be repeated herein. In embodiments illustrated in FIG. 4B, the filler dielectric includes first and second dielectric layers 435 and 436. Each layer of the filler dielectric includes an associated thickness and etch rate that will affect the final profile of the contact window. In embodiments illustrated in FIG. 4B, the first layer 435 has a slower etch rate than the second layer 436. Thus, as illustrated in FIG. 4C, an adjustable double slope profile may be achieved with the portions of the first 435' and second 436' layers that remain after the blanket etch.

Figure 5:
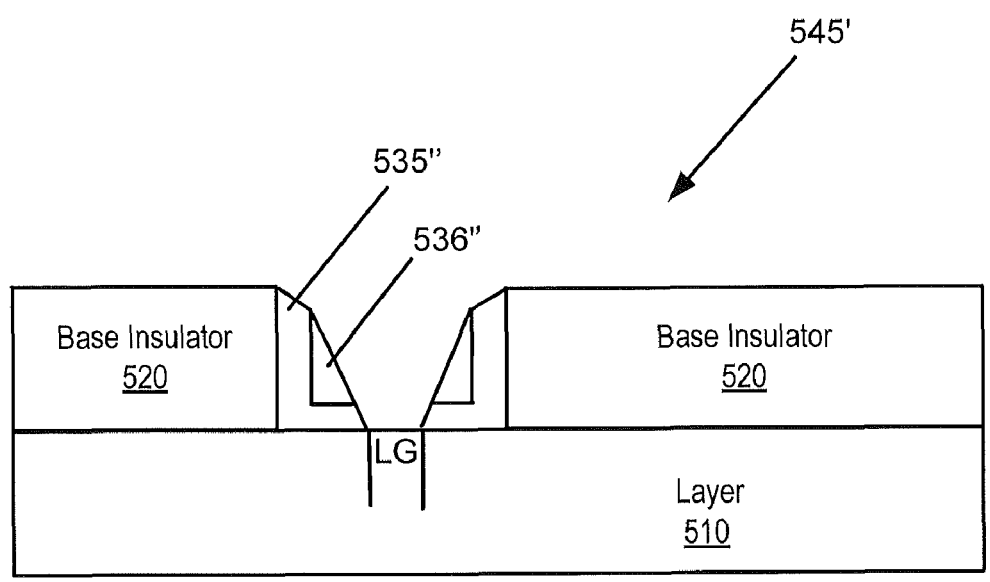

Referring now to FIG. 5, embodiments similar to embodiments illustrated in FIGS. 4A through 4C will be discussed. In particular, embodiments illustrated in FIG. 5 also have a filler dielectric having first and second layers (not shown). However, in embodiments illustrated in FIG. 5, the first layer has a faster etch rate than the second layer. Thus, the profile of the contact window illustrated in FIG. 5 including the remaining portions of the first and second layers 535" and 536" extends outward, decreasing the dimension of the wide bandgap layer 510 exposed through the contact window 545'.

Embodiments discussed above with respect to FIGS. 1A through 5 are provided for exemplary purposes only and, therefore, embodiments should not be limited to these examples. Many other profiles may be achieved using methods in accordance with embodiments discussed herein than those illustrated in FIGS. 1A through 5.

Figure 6:
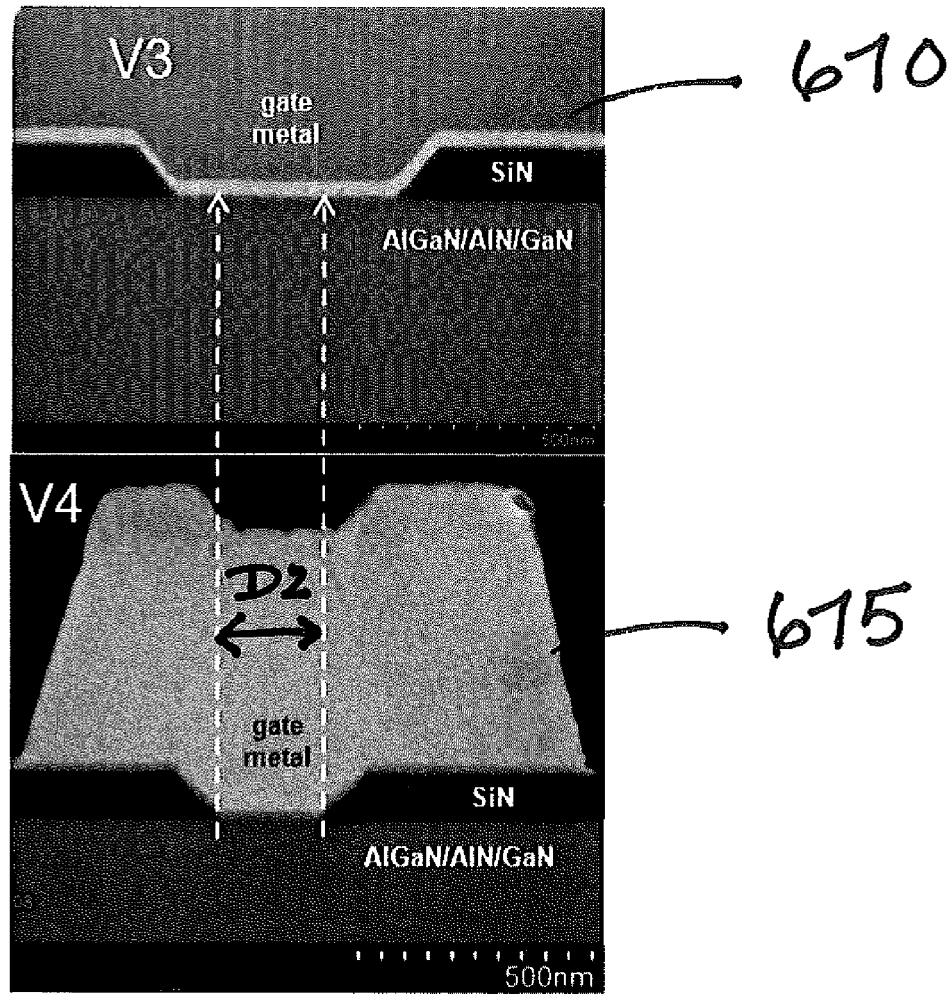
FIG. 6 is a transmission electron microscopy (TEM) cross section comparison of conventional devices versus devices in accordance with some embodiments described herein.
Figure 7:
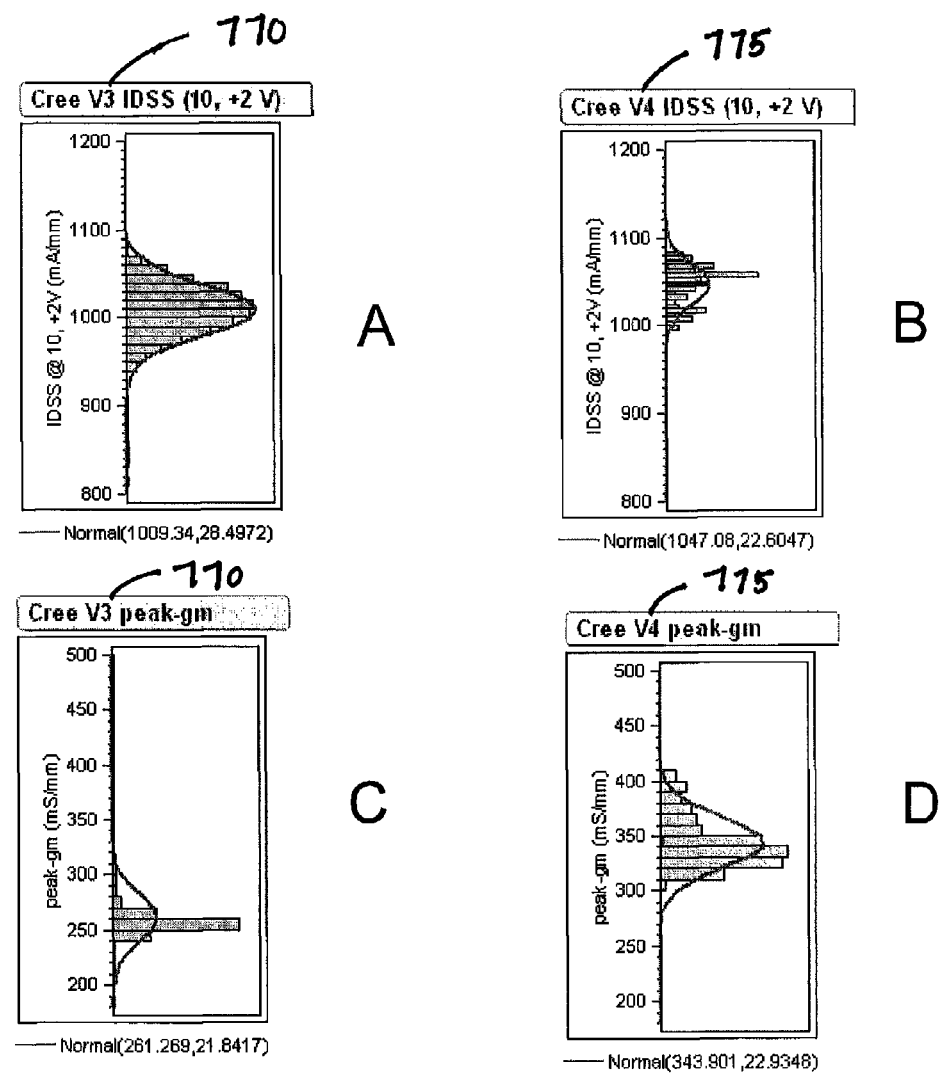
FIGS. 7A through 7D are graphs illustrating statistical distribution of $I_{DSS}$ and peak $g_m$ measured on two finger PCM structures.

Referring now to FIGS. 6 and 7, performance results with respect to embodiments illustrated in FIGS. 1A through 1D will be discussed. As illustrated in the transmission electron microscopy (TEM) cross section of FIG. 6, the dimension D2 of the gate metal of devices 675 in accordance with some embodiments of the present invention is smaller than the similar dimension of devices 670 formed using conventional methods. In other words, the gate length LG of the device 675 is smaller than the gate length of the device 670, which is illustrated by the dotted lines in FIG. 6. The dotted lines illustrating the gate length of the device 675 in accordance with embodiments discussed herein.

Referring now to FIGS. 7A through 7D, graphs illustrating statistical distribution of $I_{DSS}$ ($V_{DS}$=10V, $V_{GS}$=+2V) and peak $g_m$ ($V_{DS}$=10V) measured on 2-finger PCM structures will be discussed. As illustrated, the devices 775 in accordance with embodiments discussed herein exhibit an improvement in performance parameters over conventional devices 770. The average $g_m$ is improved by 80 mS/mm.

Figure 8:
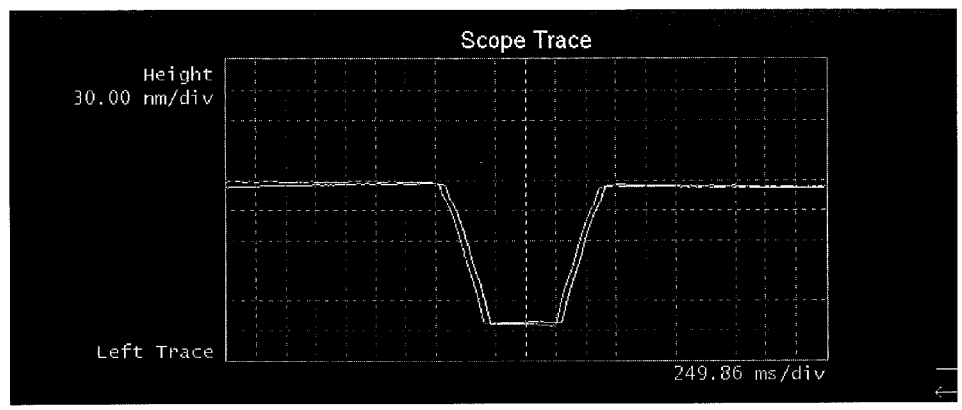
FIG. 8 is a scope trace in accordance with some embodiments illustrated in FIGS. 2A through 3C.
Figure 9:
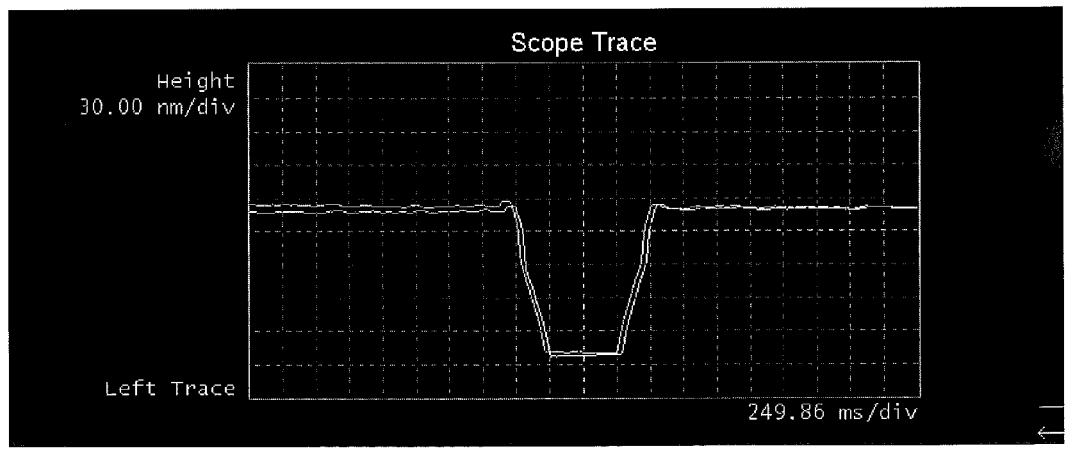
FIG. 9 is a scope trace in accordance with some embodiments illustrated in FIGS. 4A through 4C.

FIG. 8 is a sidewall profile for embodiments illustrated in FIGS. 2A through 3C having a single layer dielectric fill layer. Similarly, FIG. 9 is a sidewall profile for embodiments illustrated in FIGS. 4A through 4C having a double layer dielectric fill layer.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. A method of forming a semiconductor device having customized contacts, the method comprising:
   providing a first insulator layer;
   patterning the first insulator layer such that the first insulator layer defines at least one contact window;
   providing a second insulator layer on the first insulator layer and in the at least one contact window such that the second insulator layer at least partially fills the at least one contact window; and
   etching a first portion of the second insulator layer to expose at least a portion of a floor of the contact window such that a second portion of the second insulator layer remains in the at least one contact window to provide at least one modified contact window having dimensions that are different than dimensions of the at least one contact window.

2. The method of claim 1, wherein etching comprises etching the second insulator layer such that the second portion of the second insulator layer remains on a sidewall of the at least one contact window to provide the at least one modified contact window that is narrower than the at least one contact window.

3. The method of claim 1, further comprising providing a gate contact in the at least one modified contact window, wherein the gate contact has a gate length of less than about 0.4 µm.

4. The method of claim 3, further comprising providing source and drain regions, a respective one of which is adjacent an opposing end of the gate contact and configured to provide a high electron mobility transistor (HEMT) or a metal semiconductor field effect transistor (MESFET).

5. The method of claim 3, wherein the gate contact has a gate length of from about 0.1 µm to about 0.3 µM.

6. The method of claim 5, wherein the gate contact has a T-gate structure.

7. The method of claim 1, wherein providing the first insulator layer is preceded by providing a wide bandgap semiconductor layer and wherein providing the first insulator layer comprises providing the first insulator layer on the wide bandgap semiconductor layer.

8. The method of claim 7, wherein the wide bandgap semiconductor layer comprises gallium nitride (GaN) and/or silicon carbide (SiC).

9. The method of claim 7:
wherein patterning the first insulator layer comprises patterning the first insulator layer to expose a portion of a surface of the wide bandgap layer through the at least one contact window in the first insulator layer; and
wherein etching a first portion of the second insulator layer comprises etching a first portion of the second insulator layer such that a second portion of the second insulator layer remains in the at least one contact window so that less of the surface of the wide bandgap layer is exposed through the at least one modified contact window.

10. The method of claim 1, wherein providing the second insulator layer comprises providing at least two insulator layers and wherein providing the at least two insulator layer comprises:
providing a first layer of the second insulator layer on the first insulator layer and in the at least one contact window; and
providing a second layer of the second insulator layer on the first layer of the second insulator layer.

11. The method of claim 10, wherein the first layer of the second insulator layer has a first etch rate associated therewith and wherein the second layer of the second insulator layer has a second etch rate associated therewith, the second etch rate being different than the first etch rate.

12. The method of claim 11, wherein the first etch rate is slower than the second etch rate.

13. The method of claim 11, wherein the first etch rate is faster than the second etch rate.

14. The method of claim 1:
wherein the first insulator layer has a thickness X and the second insulator layer has a thickness Y; and
wherein a ratio of X to Y impacts the geometrical profile of the semiconductor contacts.

15. The method of claim 14, wherein X is equal to Y, X is greater than Y or X is less than Y.

16. The method of claim 14, wherein the second insulator has a first thickness A and a second thickness B and wherein a step coverage ratio of A/B impacts the geometrical profiles of the device.

17. The method of claim 1:
wherein the first insulator layer has a first etch rate associated therewith; and
wherein the second insulator layer has a second etch rate associated therewith, the second etch rate being different than the first etch rate.

18. The method of claim 17, wherein the first etch rate is slower than the second etch rate.

19. The method of claim 17, wherein the first etch rate is faster than the second etch rate.

* * * * *

UNITED STATES PATENT AND TRADEMARK OFFICE
CERTIFICATE OF CORRECTION

PATENT NO. : 8,357,571 B2
APPLICATION NO. : 12/879398
DATED : January 22, 2013
INVENTOR(S) : Radulescu et al.

It is certified that error appears in the above-identified patent and that said Letters Patent is hereby corrected as shown below:

In the Claims:

Column 9, Line 47: Please correct "length $L_{CD}$ may" to read -- length $L_{GD}$ may --

Signed and Sealed this
Thirteenth Day of August, 2013

Teresa Stanek Rea
*Acting Director of the United States Patent and Trademark Office*